United States Patent
Jao et al.

(10) Patent No.: US 12,557,679 B2
(45) Date of Patent: Feb. 17, 2026

(54) METHODS AND APPARATUS FOR USING EPOXY-BASED OR INK-BASED SPACER TO SUPPORT LARGE DIE IN SEMICONDUCTOR DEVICES

(71) Applicant: Micron Technology, Inc., Boise, ID (US)

(72) Inventors: Li Jao, Taichung (TW); Min Hua Chung, Taichung (TW); Chong Leong Gan, Taichung (TW)

(73) Assignee: Micron Technology, Inc., Boise, ID (US)

( * ) Notice: Subject to any disclaimer, the term of this patent is extended or adjusted under 35 U.S.C. 154(b) by 520 days.

(21) Appl. No.: 17/975,557

(22) Filed: Oct. 27, 2022

(65) Prior Publication Data

US 2023/0207403 A1     Jun. 29, 2023

Related U.S. Application Data

(60) Provisional application No. 63/293,333, filed on Dec. 23, 2021.

(51) Int. Cl.
| | |
|---|---|
| *H01L 23/14* | (2006.01) |
| *H01L 21/48* | (2006.01) |
| *H01L 23/31* | (2006.01) |
| *H01L 25/18* | (2023.01) |
| *H01L 23/00* | (2006.01) |

(52) U.S. Cl.
CPC ......... *H01L 23/145* (2013.01); *H01L 21/481* (2013.01); *H01L 23/3121* (2013.01); *H01L 25/18* (2013.01); *H01L 24/16* (2013.01); *H01L 24/32* (2013.01); *H01L 24/73* (2013.01); *H01L 2224/16225* (2013.01); *H01L 2224/32145* (2013.01); *H01L 2224/32225* (2013.01); *H01L 2224/73204* (2013.01)

(58) Field of Classification Search
CPC ... H01L 23/145; H01L 23/3121; H01L 25/18; H01L 24/16; H01L 24/32; H01L 24/73; H01L 2224/16225; H01L 2224/32145; H01L 2224/32225; H01L 2224/73204
See application file for complete search history.

(56) References Cited

U.S. PATENT DOCUMENTS

2006/0267609 A1* 11/2006 Lee ..................... H01L 25/0657
   257/E25.013
2020/0321316 A1* 10/2020 Watanabe ............... H01L 21/52

* cited by examiner

*Primary Examiner* — Peniel M Gumedzoe
(74) *Attorney, Agent, or Firm* — Dorsey & Whitney LLP

(57) ABSTRACT

A semiconductor device assembly includes a substrate and a first semiconductor device mounted to the substrate. An epoxy-based spacer is mounted to the substrate proximate to the first semiconductor device by an adhesive attached to a bottom surface of the epoxy-based spacer and to the substrate. A second semiconductor device is mounted directly to top surfaces of both the first semiconductor device and the epoxy-based spacer.

20 Claims, 6 Drawing Sheets

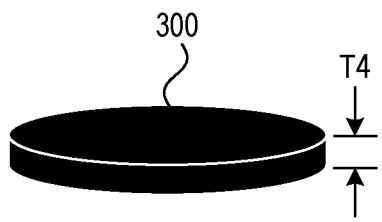
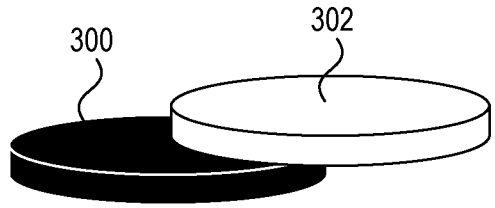
FIG. 3A  FIG. 3B
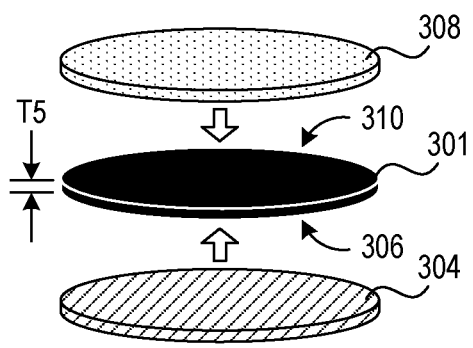
FIG. 3C
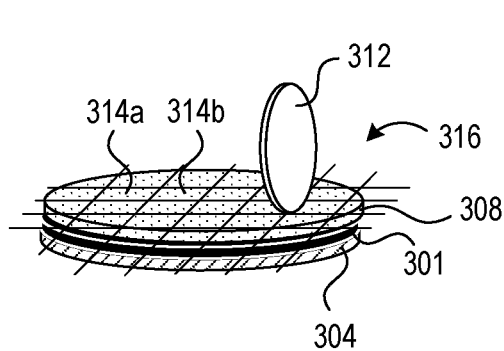
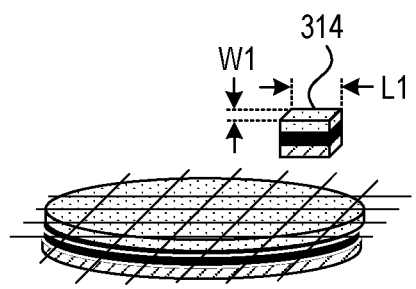
FIG. 3D  FIG. 3E

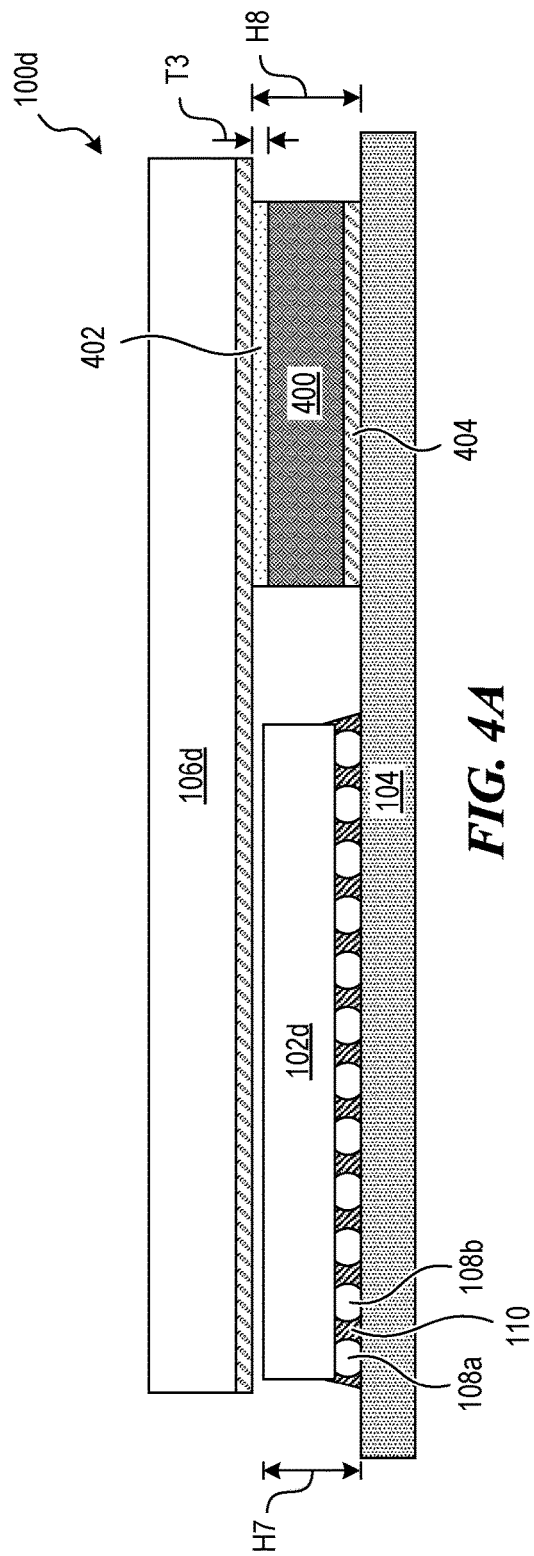
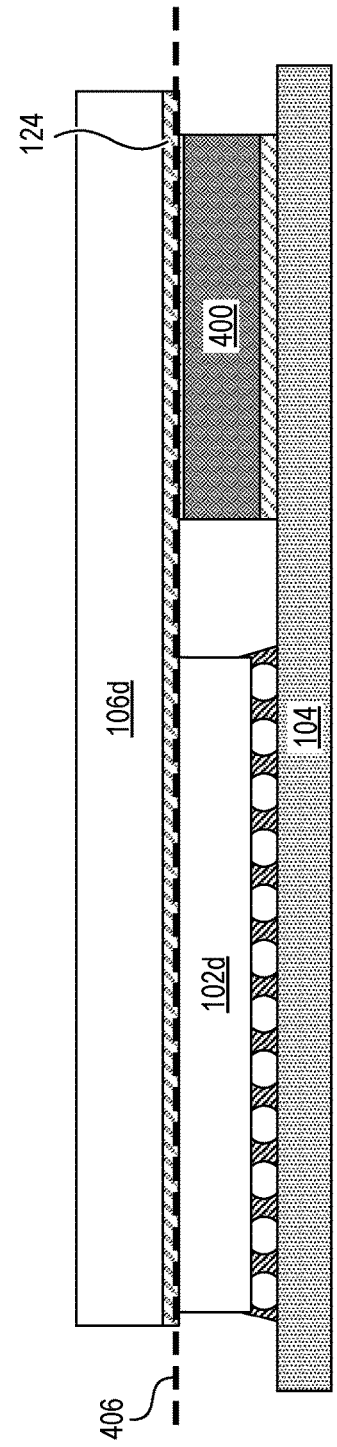

METHODS AND APPARATUS FOR USING EPOXY-BASED OR INK-BASED SPACER TO SUPPORT LARGE DIE IN SEMICONDUCTOR DEVICES

CROSS-REFERENCE TO RELATED APPLICATION(S)

The present application claims priority to U.S. Provisional Patent Application No. 63/293,333, filed Dec. 23, 2021, the disclosure of which is incorporated herein by reference in its entirety.

TECHNICAL FIELD

The present technology is directed to semiconductor device packaging. More particularly, some embodiments of the present technology relate to techniques for preventing delamination between a spacer and epoxy molding compound, thus improving the reliability of semiconductor devices.

BACKGROUND

Semiconductor dies, including memory chips, microprocessor chips, logic chips, and imager chips, are typically assembled by mounting a plurality of semiconductor dies, individually or in die stacks, on a substrate in a grid pattern. The assemblies can be used in mobile devices, computing, and/or automotive products. Spacers made of recycled silicon can be used to support overhanging portions of large chips. Although the recycled silicon is cleaned in a fabrication plant, contaminates that remain on the silicon, such as fluorine (F) and/or tin (Sn), can cause delamination which can result in failure of the device.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

FIGS. 3A-3E illustrate the method of FIG. 2 in accordance with the present technology.

FIGS. 4A and 4B are cross-sectional views of a semiconductor device assembly that includes a flip chip and an epoxy-based spacer having compressible material in accordance with the present technology.

DETAILED DESCRIPTION

Figure 1A:
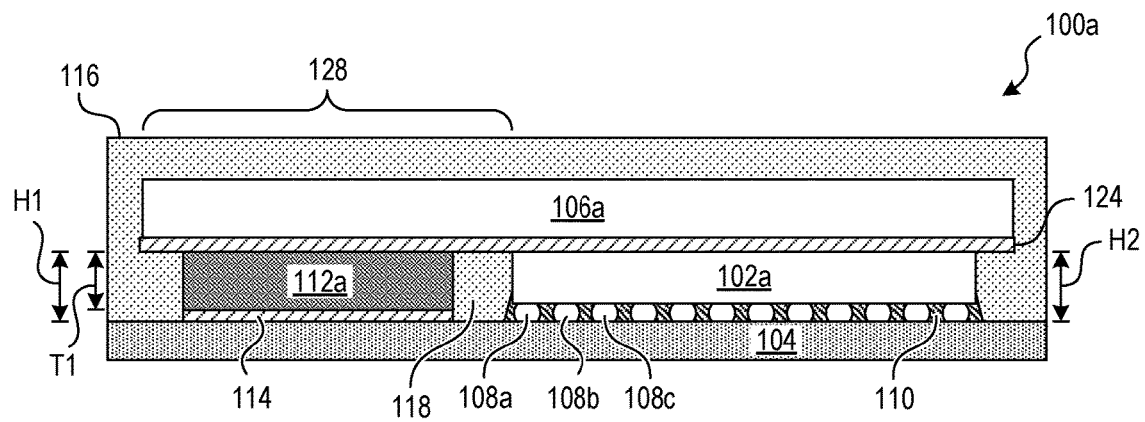
FIGS. 1A-1C are cross-sectional views of semiconductor device assemblies that include an epoxy-based spacer in accordance with the present technology.

Specific details of several embodiments of semiconductor devices are described below, including method and apparatus for reducing delamination and failure of devices due to contaminants that are present on silicon spacers. Spacers are used in some cases to support an overhang of thick and/or large dies that are mounted on components or structures and thus not directly onto a substrate. Recycled silicon is often used to form the spacers; however, the quality of re-cleaned silicon is difficult to control. When recycled silicon wafers are cleaned for use as spacers in other semiconductor device assemblies, contaminants such as fluorine (F) and/or tin (Sn) may remain on the silicon. The contaminates can lead to delamination between the silicon spacer and the surrounding epoxy molding compound (EMC).

In accordance with various embodiments of the present disclosure, spacers fabricated from epoxy-based materials or ink-based materials can be used instead of silicon spacers to address the contamination and delamination problems. A cake, disk, or wafer of an epoxy-based compound can be formed using standard tools and processes, such as a wafer level molding chase. The wafer of epoxy material can be ground or processed to a specified thickness, and then diced into spacers of the desired x, y, z dimensions. This provides the advantage of using a material that is compatible with the surrounding EMC and is not contaminated with elements that can result in delamination.

Another expected advantage is the ability to add an adhesive or a layer of adhesive to the bottom of the wafer of epoxy material prior to dicing. This simplifies the assembly of packaged devices, as an additional adhesive does not need to be applied to the substrate before the spacer is mounted, such as in a pick-and-place process.

In semiconductor device assemblies that include dies mounted with a flip chip process, slight variations can occur in the height of the mounted die. The "flip chip" is generally referred to herein as a die that is connected to the substrate via solder bumps and underfill. If too great a variation exists between the heights of the flip chip and an associated spacer, one or more gaps may occur when a larger chip is mounted over these components. Therefore, in some embodiments an optional additional layer of compressive material can be applied over a top surface of the epoxy-based spacer to compensate for these slight variations. The compressive material can be mounted to the wafer of epoxy material prior to dicing, simplifying the assembly process, or added to the spacer in situ as needed. This provides the further advantage of an overall flexible height of the spacer to compensate for variations that can result from, for example, thickness variations of the underfill under the flip chip.

In other embodiments, the spacer can be formed in situ using an inkjet printer. The ink-based spacer can be formed to a precise height, optionally over an adhesive (e.g., adhesive layer) that promotes adhesion of the ink-based spacer to the substrate. This provides a further advantage as the x, y, z dimensions can be programmed prior to forming the spacer, or at least one of the dimensions of the spacer can be actively monitored while the spacer is formed to ensure the desired dimensions are achieved. This is particularly advantageous in assemblies that include the flip chip, as the height of the flip chip may vary as discussed above.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-6. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below", "top", and "bottom" can refer to relative directions or positions of features in the semiconductor devices in view of the orientation shown in the Figures. For example, "upper", "uppermost", or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Also, as used herein, features that are, can, or may be substantially the same or equal are within 10% of each other, or within 5% of each other, or within 2% of each other, or within 1% of each other, or within 0.5% of each other, or within 0.1% of each other, according to various embodiments of the disclosure.

FIG. 1A illustrates an overview of embodiments of the present technology, while FIGS. 1B-6 illustrate further details of the present technology. Like reference numbers relate to similar components and features in FIGS. 1A-1C and 3A-5C. The present technology addresses the technical problem of contamination that can be present on recycled silicon that is used to create spacers in semiconductor device assemblies. The contaminants, which remain on the recycled silicon after the cleaning process, can cause delamination between surfaces of the spacer and the surrounding molding material and can lead to failure of the device. Therefore, a spacer comprised of epoxy-based material can prevent the delamination as no cleaning process is needed. Additionally, ink-based spacers, as discussed below in FIGS. 5A-5C can be used to replace silicon spacers. Ink-based spacers also have the advantage of not requiring a cleaning process. Further, ink-based spacers can be built on the substrate in situ, and thus can be formed with a specific height, which is an advantage when the height of neighboring components(s) may vary.

Figure 1B:
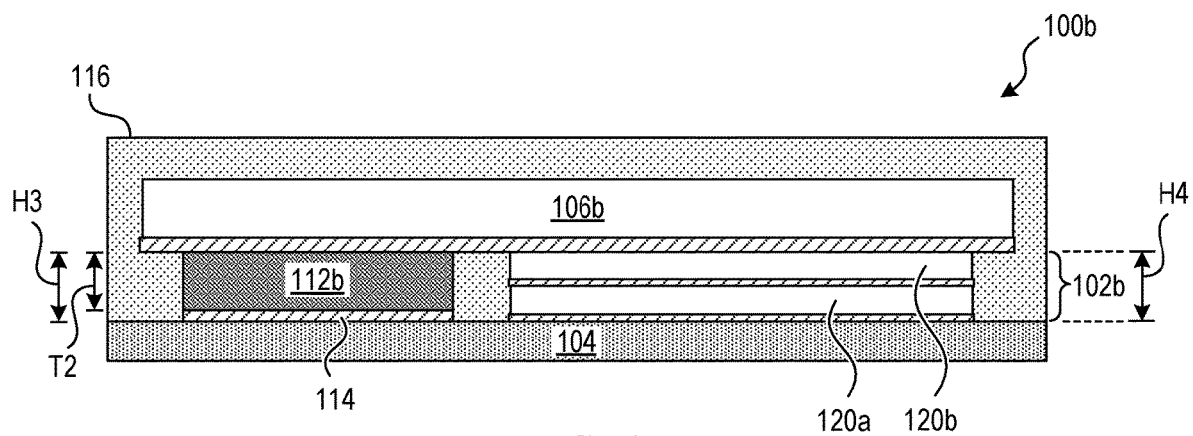
Figure 1C:
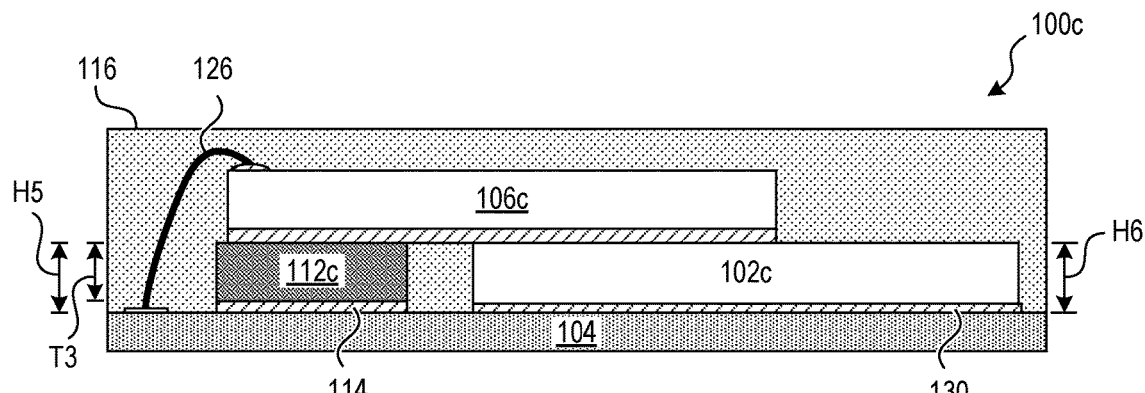

FIGS. 1A, 1B, and 1C are cross-sectional views of a semiconductor device assembly 100 that includes an epoxy-based spacer in accordance with the present technology. In FIG. 1A, the assembly 100a includes a first semiconductor device 102a that is mounted to a substrate 104. The first semiconductor device 102a can be, in this example, a flip chip and thus is mounted to the substrate 104 via a plurality of solder bumps 108a, 108b, 108c (not all are individually indicated) and underfill 110 (e.g., an epoxy polymer with filler material such as aluminum-oxide, silica, etc., or other known underfill material). The flip chip can be known types of dies/chips with different functionalities, and for convenience is referred to herein as "flip chip" based on its connection to the substrate 104 via the solder bumps 108 and underfill 110 (e.g., controlled collapse chip connection (C4)).

A second semiconductor device 106a is mounted over the first semiconductor device 102a. The second semiconductor device 106a can be an active die, such as a non-volatile storage technology such as a NAND, a dynamic random-access memory (DRAM), or other memory chip, microprocessor chip, logic chip, or imager chip as a bottom die in a die stack (not shown). In some embodiments, the second semiconductor device 106a can be mounted in the shown configuration because of its relatively large size, wherein there may not be enough room on the substrate 104 of the device assembly 100 to laterally position the first and second semiconductor devices 102a, 106a next to each other. The second semiconductor device 106a can have a relatively large overhang 128 extending away from a top surface of the first semiconductor device 102a. It is desirable to physically support the second semiconductor device 106a with an epoxy-based spacer 112a positioned beneath the overhang 128 and proximate to the first semiconductor device 102a. In some embodiments, the epoxy-based spacer 112a can be mounted to the substrate 104 via an adhesive 114 such as die attach film (DAF). Other adhesives can be used. A bottom surface of the second semiconductor device 106a can be mounted to top surfaces of the first semiconductor device 102a and the epoxy-based spacer 112a with an adhesive 124 (e.g., DAF or other known adhesive).

A height H1 from the mounting surface of the substrate 104 to a top surface of the epoxy-based spacer 112a is substantially the same as a height H2 from the mounting surface of the substrate 104 to a top surface of the first semiconductor device 102a, within a tolerance. Therefore, when the second semiconductor device 106a is mounted over the first semiconductor device 102a and the epoxy-based spacer 112a, such as with the adhesive 124, the second semiconductor device 106a is level and there is no open space or gap created between the second semiconductor device 106a and the top surfaces of the first semiconductor device 102a and the epoxy-based spacer 112a.

Molding material 116 (e.g., EMC or other suitable material) is applied to encase the components mounted on or over the substrate 104. The molding material 116 can encase, for example, a top surface and side edges of the second semiconductor device 106a (e.g., 2, 3, or 4 side edges of the second semiconductor device 106a), side edges of the first semiconductor device 102a (e.g., 2, 3, or 4 side edges of the first semiconductor device 102a), and side edges of the epoxy-based spacer 112a (e.g., 2, 3, or 4 side edges of the epoxy-based spacer 112a), as well as extending to fill open areas 118 between the epoxy-based spacer 112a and the first semiconductor device 102a. The molding material 116 can further encase and/or fill open areas between a bottom surface of the second semiconductor device 106a and the substrate 104.

Turning to FIG. 1B, the device assembly 100b can include the second semiconductor device 106b (e.g., NAND) mounted over the first semiconductor device 102b and the epoxy-based spacer 112b. In this example, the first semiconductor device 102b can be a die stack that includes a plurality of vertically stacked dies 120a, 120b. Although only two dies 120 are shown, there can be more than two, such as three, four, five, or more dies 120. In some embodiments, the dies 120a, 120b can be dynamic ram chips (DRAM). Again, a height H3 from the mounting surface of the substrate 104 to the top surface of the epoxy-based spacer 112b is substantially the same as a height H4 from the mounting surface of the substrate 104 to a top surface of the first semiconductor device 102b, within a tolerance. In some embodiments, the height H4 includes the dies 120a, 120b, as well as adhesive or adhesive layers that attach the dies 120a, 120b to each other and to the substrate 104.

FIG. 1C shows the device assembly 100c that includes the second semiconductor device 106c mounted over the first semiconductor device 102c and the epoxy-based spacer 112c. The first semiconductor device 102c can be a single die mounted to the substrate 104 with an adhesive 130. The second semiconductor device 106c has an electrical connection, such as wire bond 126, that connects to the substrate 104. Although a single wire bond 126 is shown, multiple wire bonds 126 can be used. The epoxy-based spacer 112 is stiff enough to provide the support for the second semiconductor device 106c, which overhangs the first semiconductor device 102c in a shingled configuration, during the wire bonding process. In some cases, the application of heat and/or pressure during the wire bonding process can result in weakening of components unless adequate support/cushion is provided so that top die (e.g., second semiconductor device 106c) does not flex, tilt, or cause pressure that can cause damage to the lower die (e.g., first semiconductor device 102c) and/or contact the substrate 104. A height H5 from the mounting surface of the substrate 104 to the top surface of the epoxy-based spacer 112c is substantially the same as a height H6 from the mounting surface of the substrate 104 to a top surface of the first semiconductor device 102c, within a tolerance. The heights H1, H3, and H5 and thus thicknesses T1, T2, T3 of the epoxy-based spacers 112a, 112b, 112c, are based on the corresponding heights H2, H4, H6 (e.g., thicknesses) of the first semiconductor devices 102a, 102b, 102c that include the connections to the substrate 104 such as the solder bumps 108, underfill 110, adhesive 130, etc. Therefore, the heights H1, H3, and H5 can vary depending upon the particular configuration within the device assembly 100.

Figure 2:
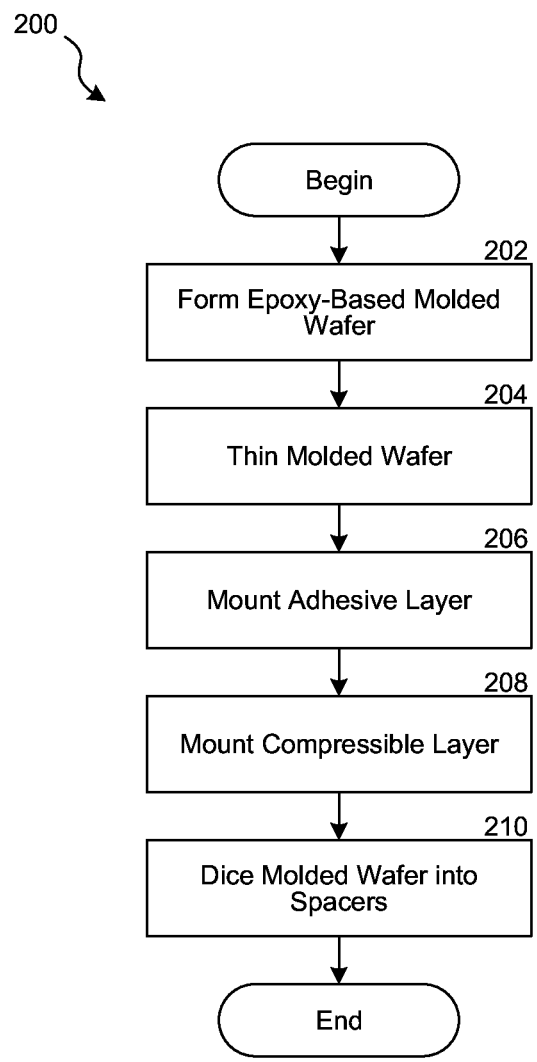
FIG. 2 is a flow chart of a method for manufacturing a plurality of epoxy-based spacers in accordance with the present technology.

FIG. 2 is a flow chart of a method 200 for manufacturing a plurality of epoxy-based spacers in accordance with the present technology, and will be discussed together with FIGS. 3A-3E that illustrate the method of FIG. 2. An epoxy-based molded wafer can be formed (block 202). Referring to FIG. 3A, an epoxy-based material such as, but not limited to, EMC can be placed into a wafer level molding chase (not shown) and cured to form an epoxy-based cake or wafer 300. The process of curing can be dependent upon the particular epoxy-based material that is used, and is not limited to any specific curing method. In some embodiments, a 12-inch molding chase can be used, although other sizes are contemplated. In some cases, the molding chase is sized to allow a thickness T4 of the epoxy-based wafer 300 to be at least slightly thicker than a desired finished thickness of a thinned wafer (such as T1, T2, T3 of FIGS. 1A-1C) that can be used to form the associated epoxy-based spacers 112a, 112b, 112c.

After the epoxy-based wafer 300 is formed, the wafer 300 can be thinned to a desired thickness T5 (block 204) as indicated in FIG. 3C. For example, the thickness T5 may correspond to one or more of the thicknesses T1, T2, T3 indicated in FIGS. 1A-1C. In some embodiments a grinding wheel 302 can be used to thin the wafer 300 as shown in FIG. 3B.

Referring to FIG. 3C, in some embodiments, an adhesive 304 can be applied to a first side 306 of thinned epoxy-based wafer 301 (block 206). The adhesive 304 can be a layer of DAF which may be available in a sheet that matches the diameter (e.g., 12-inch) of the thinned epoxy-based wafer 301. Although other adhesives can be used, it is an advantage of the method of FIG. 2 to use commercially available products such as the discs of DAF. In other embodiments, the adhesive can be applied during the assembly process of the device assembly 100.

As discussed further below in FIGS. 4A and 4B, when the first semiconductor device 102 is a flip chip that uses underfill 110 during the assembly process, a height of the first semiconductor device 102 can vary slightly and may result in the tilting of the second semiconductor device 106 and nonuniformities of adhesion across one or both of the top surfaces of the first semiconductor device 102 and the epoxy-based spacer 112. To compensate for possible height differences between the first semiconductor device 102 and the spacer 112, in some embodiments a compressible material 308 can be mounted/applied to a second side 310 of the thinned epoxy-based wafer 301 (block 208). For example, the compressible material 308 can be spin coated or wafer mounted (e.g., laminated). The compressible material 308 can be a polymer-based buffer layer, and in some embodiments can be film-over wire or flow-over wire (FOW). The compressible material 308 can be configured to have a range of compression, such as to provide a thickness within and up to one micron, two microns, three microns or more, or any fraction thereof, etc.

Referring to FIG. 3D, assembly 316 can be diced into spacers 314a, 314b (not all of the spacers 314 are indicated separately) (block 210 of FIG. 2). For example, a dicing saw with a blade 312 can be used. This process can leave detectable saw-marks on at least one of the side edges of the spacers 314. Although the spacers 314 are created in a grid pattern, forming square or rectangular-shaped spacers that have a length L1 and width W1 (as shown in FIG. 3E), other shapes can be formed. Also, the length L1 and width W1 may be determined based on the desired size of the epoxy-based spacer 112 and may change from one device assembly 100 to another depending upon requirements.

As shown in FIG. 3D, the spacers 314 are spacers 112 that include the adhesive 304 and the compressible material 308. In other embodiments, the spacers 314 can include one or none of the adhesive 304 and the compressible material 308. Each of the spacers 314, with or without the adhesive 304 and/or compressible material 308, can be positioned on the substrate 104 using pick-and-place or other known techniques.

FIGS. 4A and 4B are cross-sectional views of the semiconductor device assembly 100d including the first semiconductor device 102d and an epoxy-based spacer 400 that includes a compressible material 402 and an adhesive 404 in accordance with the present technology. In some embodiments the epoxy-based spacer 400 can include the layers of the compressible material 402 and the adhesive 404 as discussed above in FIGS. 3C and 3D, while in other embodiments the compressible material 402 and/or the adhesive 404 can be applied separately when assembling the device assembly 100d.

Although the first semiconductor device 102d is shown as a flip chip, other types of devices and chips can be used with the epoxy-based spacer 400. As discussed above, the underfill 110 can result in slight variations in height H7 of the first semiconductor device 102d. Therefore, it is possible that without the compressible material 402, the epoxy-based spacer 400 can be slightly too tall or slightly too short. This can result in a gap between the first and second semiconductor devices 102d, 106d, and/or a gap between the spacer 400 and the second semiconductor device 106d due to tilt of the second semiconductor device 106d. In some cases, molding material 116 may work into the gap(s) and cause delamination. Therefore, the compressible material 402 can have a thickness T3 that allows a predetermined amount of compressibility such that when the second semiconductor device 106d is mounted on the first semiconductor device 102d and the epoxy-based spacer 400 with the adhesive 124, the compressible material 402 is compressed to form co-planarity between interfacing surfaces of the devices, as shown by dashed line 406 in FIG. 4B. As discussed above, the compressible material 402 can be configured to provide a range of compressibility up to 1 micron, 2 microns, 3 microns, or a fraction thereof, or greater than 3 microns.

Figure 5A:
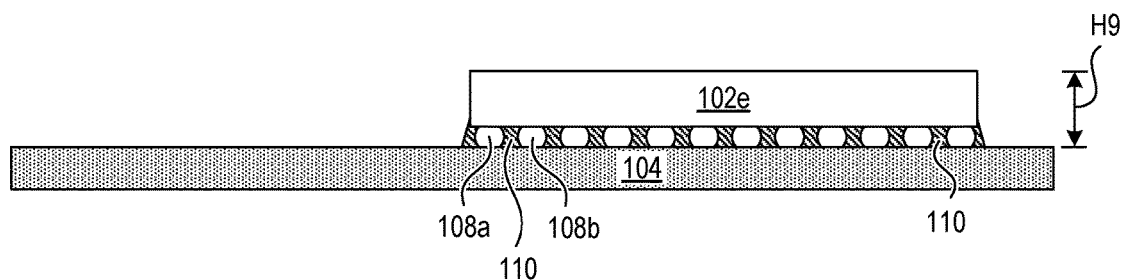
FIGS. 5A-5C illustrate a method for manufacturing an ink-based spacer in situ in accordance with the present technology.
Figure 5B:
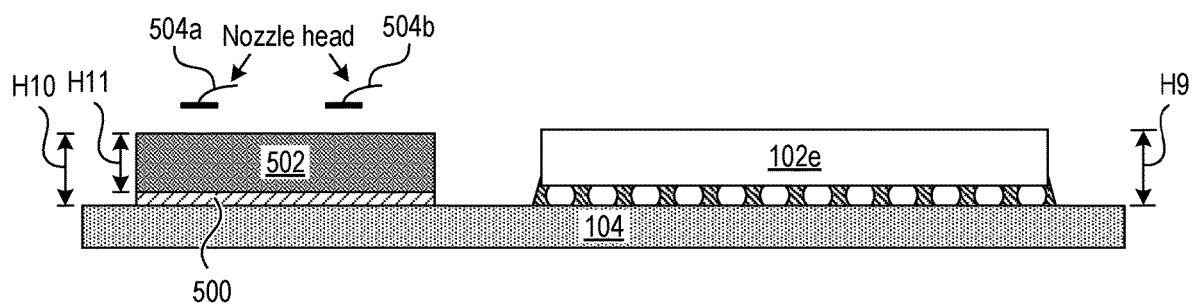
Figure 5C:
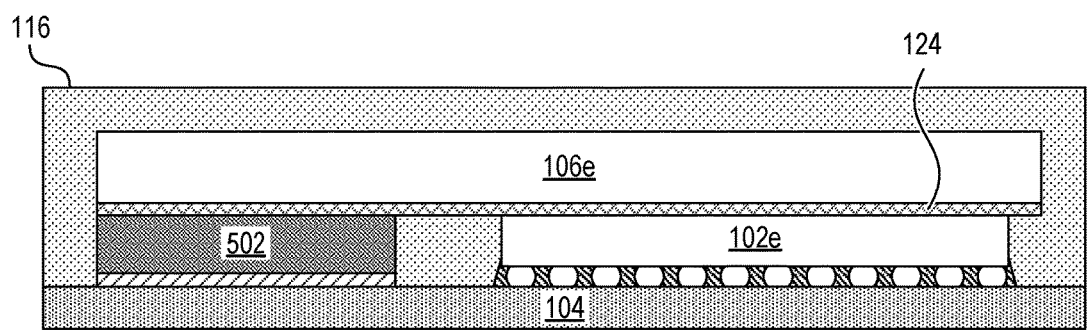

FIGS. 5A-5C illustrate a method for manufacturing an ink-based spacer in situ on the substrate 104 in accordance with the present technology. In FIG. 5A, a first semiconductor device 102e can be mounted on the substrate 104. In this example, the first semiconductor device 102e is a flip chip that is interconnected with the substrate 104 with a plurality of solder bumps 108a, 108b and underfill 110. It should be understood that other types of chips and connection interfaces (e.g., adhesive, wire bonding, etc.) can be used in other embodiments utilizing the ink-based spacer. A height H9 of the first semiconductor device 102e, including the connections (e.g., solder bumps 108 and underfill 110, adhesive, etc.) can be determined. Plasma cleaning can also be accomplished prior to depositing the ink-based spacer.

In FIG. 5B, an adhesive 500 can be applied to the substrate 104. In some embodiments the adhesive 500 is optional. The adhesive 500 can be used to improve or promote the adhesion between an ink-based spacer 502 and the substrate 104. One or more nozzles 504a, 504b of, for example, an inkjet printer (not shown) can be used to deposit the material used to print the ink-based spacer 502.

In some embodiments, nano-inks of iron (Fe), aluminum (Al), copper (Cu), and/or high carbon content ink, such as with nanoparticles, can be used. The process and the materials used in inkjet printing (e.g., using three-dimensional (3D) printer with ink or other material) are compatible with EMC, in terms of, but not limited to, coefficient of thermal expansion, modulus, etc. An inkjet printer can be programmed to build the ink-based spacer 502 to precise x, y, z dimensions. For example, height H10 dimension, including a thickness of the adhesive 500, can be calculated so that the height H10 is substantially equal to the height H9 of the first semiconductor device 102e. In some embodiments, height H11 comprising the ink material can be determined and the inkjet printer programmed prior to depositing the ink material. In other embodiments, the height H11, and thus height H10, can be actively monitored as the ink material is added, such that a precise height alignment is achieved. Advantages and benefits of using the ink-based spacer 502 and the inkjet printing process are that the ink-based spacers 502 are scalable, such that different dimensions of spacers can quickly and easily be manufactured. In some embodiments, a one-micron thickness to approximately 200-micron thicknesses can be accommodated, although other thickness are contemplated. Further, different sizes of ink-based spacers 502 can quickly be programmed and the process is cost effective, at least due to process simplification.

As shown in FIG. 5C, second semiconductor device 106e can be mounted over the ink-based spacer 502 and the first semiconductor device 102e, such as with the adhesive 124. The second semiconductor device 106e is level and no gaps are formed between the components because the heights H9 and H10 (as indicated in FIG. 5B) are substantially the same. The molding material 116 can then be formed/applied as discussed previously.

Figure 6:
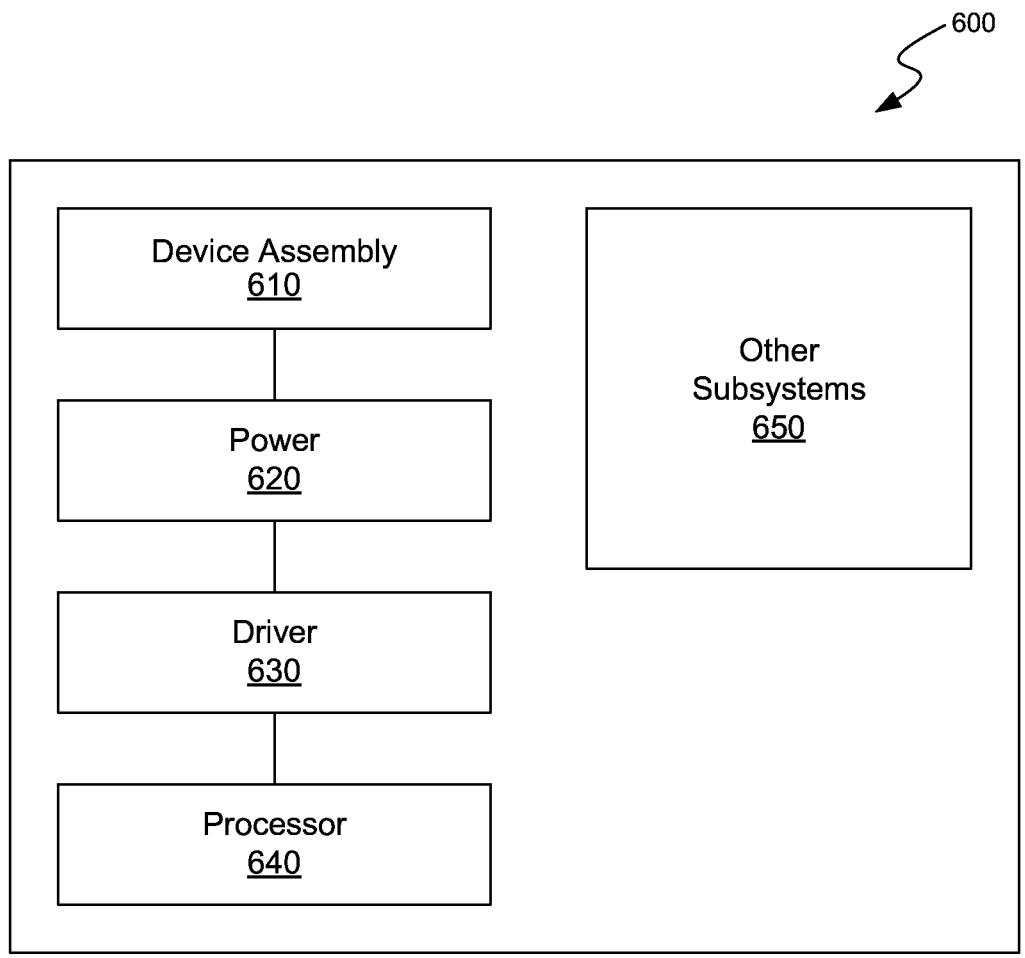
FIG. 6 is a schematic view showing a system that includes a semiconductor device assembly configured in accordance with an embodiment of the present technology.

Any one of the semiconductor devices, assemblies, and/or packages described above with reference to FIGS. 1A through 5C can be incorporated into any of a myriad of larger and/or more complex systems, a representative example of which is system 600 shown schematically in FIG. 6. The system 600 can include a semiconductor device assembly 610, a power source 620, a driver 630, a processor 640, and/or other subsystems or components 650. The semiconductor device assembly 610 can include features generally similar to those of the semiconductor device assemblies described above. The resulting system 600 can perform any of a wide variety of functions such as memory storage, data processing, and/or other suitable functions. Accordingly, representative systems 600 can include, without limitation, hand-held devices (e.g., mobile phones, tablets, digital readers, and digital audio players), computers, vehicle and other machines and appliances. Components of the system 600 may be housed in a single unit or distributed over multiple, interconnected units (e.g., through a communications network). The components of the system 600 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device assembly, comprising:
a substrate;
a first semiconductor device mounted to the substrate;
an epoxy-based spacer mounted to the substrate proximate to the first semiconductor device by an adhesive attached to a bottom surface of the epoxy-based spacer and to the substrate, wherein a top surface of the epoxy-based spacer comprises a compressible material, and wherein the compressible material is film-over wire or flow-over wire; and a second semiconductor device mounted directly to top surfaces of both the first semiconductor device and the epoxy-based spacer.

2. The semiconductor device assembly of claim 1, wherein the first semiconductor device is mounted to the substrate via a plurality of solder bumps and underfill.

3. The semiconductor device assembly of claim 1, wherein the epoxy-based spacer comprises a saw-mark on at least one edge.

4. The semiconductor device assembly of claim 1, wherein the compressible material and the adhesive are applied to the epoxy-based spacer prior to the adhesive being attached to the substrate.

5. The semiconductor device assembly of claim 1, further comprising molding material formed over at least two side edges of each of the first and second semiconductor devices and over at least two side edges of the epoxy-based spacer.

6. The semiconductor device assembly of claim 1, wherein the adhesive is die attach film.

7. A semiconductor device assembly, comprising:
a substrate;
an epoxy-based spacer directly attached to the substrate by a first adhesive, wherein the epoxy-based spacer further comprises a compressible material at a top surface of the epoxy-based spacer;
a first semiconductor device mounted to the substrate proximate to the epoxy-based spacer;
a second semiconductor device mounted directly to top surfaces of both the first semiconductor device and the epoxy-based spacer by a second adhesive; and
molding material encasing a top surface and side edges of the second semiconductor device, the molding material further encasing at least two side edges of the first semiconductor device, the molding material further encasing at least two side edges of the epoxy-based spacer.

8. The semiconductor device assembly of claim 7, wherein the first semiconductor device is mounted to the substrate via a plurality of solder bumps and underfill.

9. The semiconductor device assembly of claim 7, wherein the first semiconductor device comprises at least two dies in a stacked-die arrangement.

10. The semiconductor device assembly of claim 7, wherein the second semiconductor device is electrically connected to the substrate via at least one wire bond that extends outside of the first semiconductor device.

11. A method for fabricating a semiconductor device assembly, comprising:

mounting a first semiconductor device to a substrate;
mounting an epoxy-based spacer to the substrate proximate to the first semiconductor device by an adhesive attached to a bottom surface of the epoxy-based spacer and to the substrate, wherein a top surface of the epoxy-based spacer comprises a compressible material, and wherein the compressible material is film-over wire or flow-over wire; and
mounting a second semiconductor device directly to top surfaces of both the first semiconductor device and the epoxy-based spacer.

12. The method of claim 11, further comprising:
adding the compressible material to the epoxy-based spacer after mounting the epoxy- based spacer to the substrate.

13. The method of claim 11, further comprising:
forming a molding material over at least two side edges of each of the first and second semiconductor devices and over at least two side edges of the epoxy-based spacer.

14. The method of claim 11, further comprising:
compressing, based on mounting the second semiconductor device, the compressible material to form co-planarity between interfacing surfaces of the first semiconductor device and the epoxy-based spacer.

15. The method of claim 11, further comprising:
forming a wire bond between the substrate and a top surface of the second semiconductor device.

16. The method of claim 11, further comprising:
forming a molded wafer comprising epoxy molding compound;
thinning the molded wafer; and
dicing the thinned molded wafer into a plurality of epoxy-based spacers comprising the epoxy-based spacer, wherein the epoxy-based spacer is mounted to the substrate after the dicing.

17. The method of claim 16, further comprising:
subsequent to thinning the molded wafer, attaching an adhesive to a bottom side of the thinned molded wafer.

18. The method of claim 16, further comprising:
subsequent to thinning the molded wafer, applying the compressible material to a top side of the thinned molded wafer.

19. The method of claim 18, wherein the compressible material is applied using A) spin coating, B) wafer mounting, or C) lamination.

20. The method of claim 16, wherein forming the molded wafer further comprises:
filling a wafer-level molding chase with the epoxy molding compound, and
curing the molded wafer in the wafer-level molding chase.

* * * * *